United States Patent
Abdo

(10) Patent No.: US 9,953,268 B2
(45) Date of Patent: Apr. 24, 2018

(54) QUANTUM NONDEMOLITION MICROWAVE PHOTON COUNTER BASED ON THE CROSS-KERR NONLINEARITY OF A JOSEPHSON JUNCTION EMBEDDED IN A SUPERCONDUCTING CIRCUIT

(71) Applicant: International Business Machines Corporation, Armonk, NY (US)

(72) Inventor: Baleegh Abdo, Carmel, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 140 days.

(21) Appl. No.: 14/952,133

(22) Filed: Nov. 25, 2015

(65) Prior Publication Data

US 2017/0089961 A1   Mar. 30, 2017

Related U.S. Application Data

(63) Continuation of application No. 14/870,663, filed on Sep. 30, 2015.

(51) Int. Cl.
| | |
|---|---|
| G01J 1/42 | (2006.01) |
| G06N 99/00 | (2010.01) |
| G01V 8/00 | (2006.01) |
| H01P 7/08 | (2006.01) |
| G01R 23/02 | (2006.01) |
| H01P 1/203 | (2006.01) |

(52) U.S. Cl.
CPC ........... G06N 99/002 (2013.01); G01R 23/02 (2013.01); G01V 8/005 (2013.01); H01P 1/20381 (2013.01); H01P 7/082 (2013.01)

(58) Field of Classification Search
CPC ... G06N 99/002; G01R 15/241; G01R 15/243
See application file for complete search history.

(56) References Cited

U.S. PATENT DOCUMENTS

2011/0022340 A1* 1/2011 DiVincenzo ........... B82Y 10/00
702/72

OTHER PUBLICATIONS

Baleegh Abdo, "Quantum Nondemolition Microwave Photon Counter Based on the Cross-Kerr Nonlinearity of a Josephson Junction Embedded in a Superconducting Circuit" U.S. Appl. No. 14/870,663, filed Sep. 30, 2015.
List of IBM Patents or Patent Applications Treated as Related; Date Filed: Nov. 25, 2015, p. 1-2.

* cited by examiner

*Primary Examiner* — Kenneth J Malkowski
(74) *Attorney, Agent, or Firm* — Cantor Colburn LLP; Vazken Alexanian

(57) ABSTRACT

A technique relates to a microwave device. A pump resonator, at a first pump resonator end, is connected to both a dispersive nonlinear element and a first stub. The pump resonator, at a second pump resonator end, is capacitively coupled to a pump port, where the first stub is terminated in an open circuit. A quantum signal resonator, at a first quantum signal resonator end, is connected to both the dispersive nonlinear element and a second stub. The quantum signal resonator, at a second signal resonator end, is capacitively coupled to a signal port, where the second stub is connected to ground.

9 Claims, 7 Drawing Sheets

COUPLE A PUMP RESONANCE MODE OF A PUMP RESONATOR AND A SIGNAL RESONANCE MODE OF A QUANTUM SIGNAL RESONATOR TO A DISPERSIVE NONLINEAR ELEMENT, RESPONSIVE TO A PUMP SIGNAL AT A PUMP RESONANCE FREQUENCY AND A QUANTUM SIGNAL AT A SIGNAL RESONANCE FREQUENCY, WHERE THE PUMP RESONANCE MODE OF THE PUMP RESONATOR HAS THE PUMP RESONANCE FREQUENCY, WHERE THE SIGNAL RESONANCE MODE OF THE QUANTUM SIGNAL RESONATOR HAS THE SIGNAL RESONANCE FREQUENCY 605

CREATE A NONLINEAR INTERACTION BETWEEN THE PUMP SIGNAL AND THE QUANTUM SIGNAL, BY STRONGLY DRIVING THE PUMP RESONANCE MODE WITH THE COHERENT PUMP SIGNAL AT THE PUMP RESONANCE FREQUENCY 610

DETECT A PRESENCE OR ABSENCE OF PHOTONS IN THE QUANTUM SIGNAL ACCORDING TO THE PUMP RESONANCE FREQUENCY OF THE PUMP MODE 615

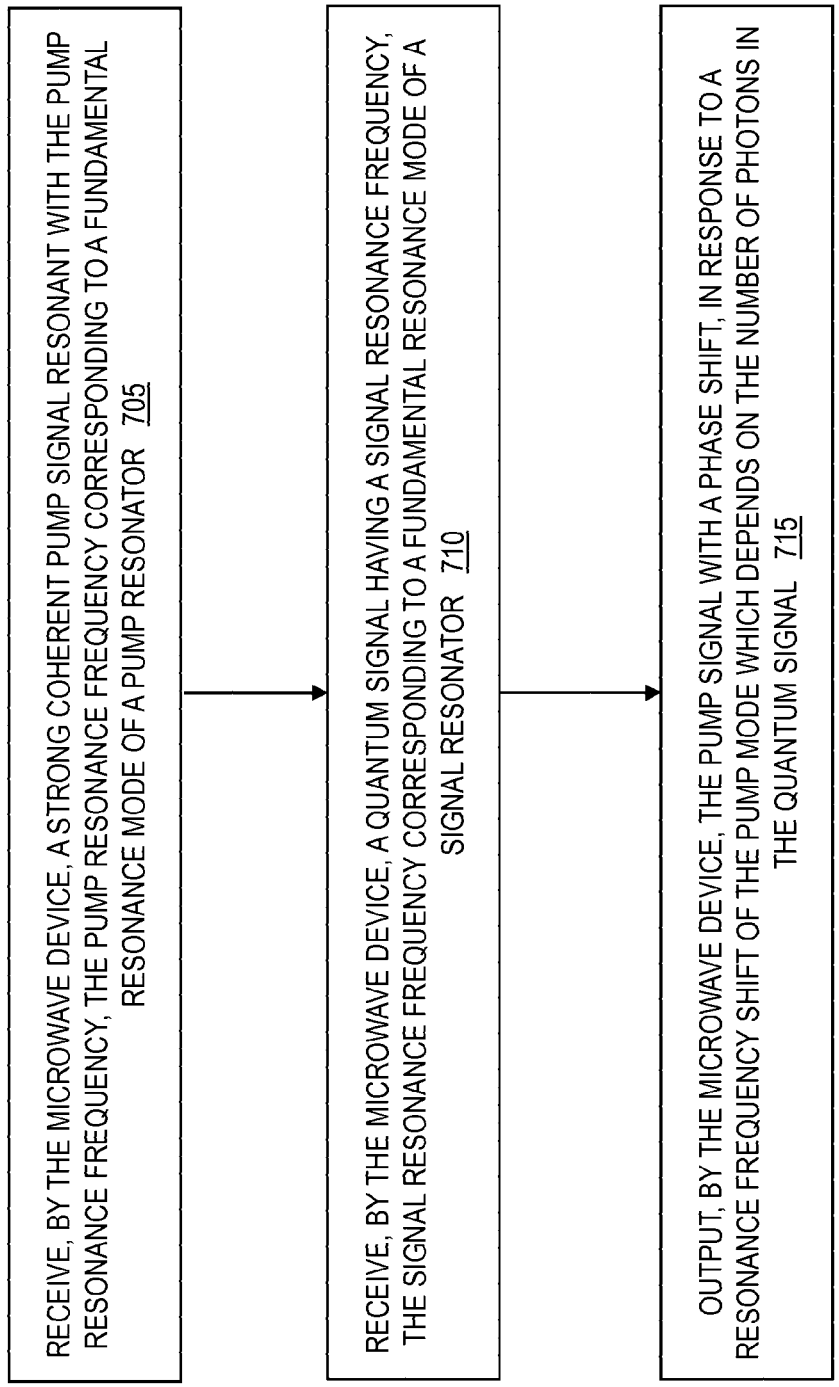

QUANTUM NONDEMOLITION MICROWAVE PHOTON COUNTER BASED ON THE CROSS-KERR NONLINEARITY OF A JOSEPHSON JUNCTION EMBEDDED IN A SUPERCONDUCTING CIRCUIT

DOMESTIC PRIORITY

This application is a continuation of U.S. patent application Ser. No. 14/870,663, filed Sep. 30, 2015, the disclosure of which is incorporated by reference herein in its entirety.

BACKGROUND

The present invention relates to measurement techniques of quantum systems operating in the microwave frequency domain, such as superconducting quantum circuits, and more specifically, to detection and/or counting of single microwave photons in a nondemolition manner.

A photon is an elementary particle, the quantum of light and all other forms of electromagnetic radiation. A photon carries energy proportional to the radiation frequency and has zero rest mass.

One reason why the detection of single microwave photons is an outstanding challenge is because the energy of a single microwave photon is very small. The energy of a photon in the microwave domain, for example in the range 1-10 gigahertz, is at least $10^4$ times smaller than the energy of a visible light photon.

Circuit quantum electrodynamics (cQED) is one of the leading architectures for realizing a quantum computer based on superconducting microwave circuits. It employs artificial atoms made of nonlinear superconducting devices called qubits which are dispersively coupled to microwave resonators, i.e., the frequencies of the qubits and resonators are detuned. As one example, each superconducting qubit may comprise one or more Josephson junctions shunted by capacitors in parallel with the junctions. The qubits are capacitively coupled to two-dimensional (2D) planar waveguide resonators or three-dimensional (3D) microwave cavities. The electromagnetic energy associated with the qubit is stored in the Josephson junctions and in the capacitive and inductive elements forming the qubit. To date, a major focus has been on improving lifetimes of the qubits in order to allow calculations (i.e., manipulation and readout) to take place before the information is lost due to decoherence of the qubits.

Dispersively coupling a superconducting qubit to a microwave resonator in a cQED architecture loads the resonator and makes its resonance frequency dependent on the quantum state of the qubit (i.e., the resonance frequency of the resonator is different depending on whether the qubit is in the ground or excited states). This property enables the performance of quantum nondemolition measurement of the qubit state, by sending a microwave signal on the order of a few photons to the cQED near the resonator frequency, and measuring the amplitude and/or phase of the output microwave field that carries information about the qubit state. Thus, one potential application of a working and reliable single photon detector in the microwave domain is to enable measuring this weak output signal (i.e., detecting the qubit state) inside the dilution fridge, without requiring the use of high-gain, low-noise, and high-isolation output chains that are typically used nowadays in order to perform such measurements.

SUMMARY

According to one embodiment, a microwave device is provided. The microwave device includes a dispersive nonlinear element, and a pump resonator, at a first pump resonator end, connected to both the dispersive nonlinear element and a first stub. The pump resonator, at a second pump resonator end, is capacitively coupled to a pump port, where the first stub is terminated in an open circuit. Also, the microwave device includes a quantum signal resonator, at a first quantum signal resonator end, connected to both the dispersive nonlinear element and a second stub. The quantum signal resonator, at a second signal resonator end, is capacitively coupled to a signal port, wherein the second stub is connected to ground.

According to one embodiment, a method for nondemolition counting of photons is provided. The method includes coupling a pump resonance mode of a pump resonator and a signal resonance mode of a quantum signal resonator to a dispersive nonlinear element, responsive to a pump signal at a pump resonance frequency and a quantum signal at a signal resonance frequency. The pump resonance mode of the pump resonator has the pump resonance frequency, where the signal resonance mode of the quantum signal resonator has the signal resonance frequency. Also, the method includes creating a nonlinear interaction between the pump signal and the quantum signal, by driving the pump resonance mode with the pump signal at the pump resonance frequency, and detecting a presence or absence of photons in the quantum signal according to the pump resonance frequency which affects an output pump signal being measured.

According to one embodiment, a method of operating a microwave device is device. The method includes receiving, by the microwave device, a pump signal at a pump resonance frequency, where the pump resonance frequency corresponds to a pump resonance mode of a pump resonator. The method includes receiving, by the microwave device, a quantum signal at a signal resonance frequency, where the signal resonance frequency corresponds to a signal resonance mode of a signal resonator, and outputting, by the microwave device, the pump signal with a phase shift, in response to a number of photons in the quantum signal.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

FIG. 6 is a flow chart of a method for nondemolition counting and/or detection of photons using the microwave device according to an embodiment.

FIG. 7 is a flow chart of a method for the microwave device according to an embodiment.

DETAILED DESCRIPTION

In the optical frequency domain, reliable single photon detectors such as photomultipliers, microwave kinetic inductance detectors, and superconducting nanowire single-photon detector are widely used in various experiments and applications. However, one disadvantage of these devices is that they destroy (i.e., absorb) the photons that they detect.

In contrast, in the microwave domain, i.e., the gigahertz (GHz) range, reliable and practical single photon detectors are still under research and development. A working microwave photon detector based on Josepshon junctions (dubbed the Josephson photomultiplier) has been experimentally researched. However, similar to single photon detectors in the optical domain this device absorbs the photons it detects. Additionally, this microwave device under development does not count the number of photons present in an incoming signal, it can only distinguish between the cases of zero photons or at least one photon in the signal.

Embodiments provide a practical scheme for a microwave device and measurement method for counting single microwave photons. Embodiments are configured to 1) detect and count the number of single photons within a certain bandwidth in the microwave domain, (i.e., in the gigahertz (GHz) range, e.g., the 1-20 GHz range), and 2) perform the detection and counting of photons in a nondemolition manner, i.e., without destroying (or absorbing) the photons being detected or counted.

Figure 1:
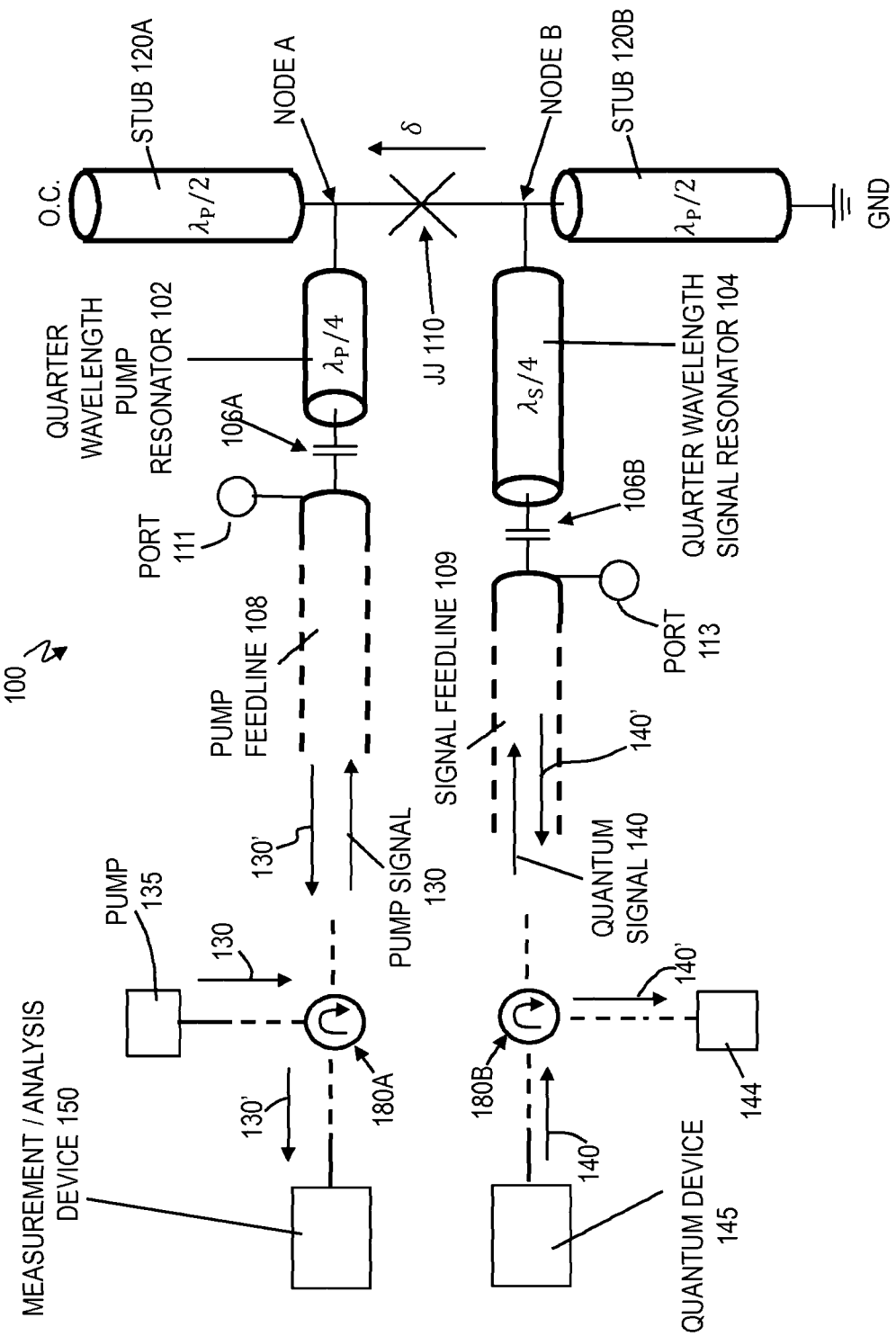
FIG. 1 is a schematic of a microwave device according to an embodiment.

Now turning to the figures, FIG. 1 is a schematic of a microwave device 100 according to an embodiment. The microwave device 100 includes a quarter-wavelength resonator 102 for the pump drive and a quarter-wavelength resonator 104 for the quantum signals. One end of the pump resonator 102 is connected to a coupling capacitor 106A, and the coupling capacitor 106A connects to a pump feedline 108. The pump feedline 108 is connected to pump port 111 and/or the pump port 111 is on the pump feedline 108. The pump feedline 108 receives a microwave pump signal 130 (i.e., a strong microwave tone), from a microwave generator 135 (denoted as pump). The other end of the pump resonator 102 connects to both a dispersive nonlinear element, e.g., Josephson junction (JJ) 110 and connects to a half-wavelength stub at the pump frequency 120A. The connection of the pump resonator 102, Josephson junction (JJ) 110, and stub 120A may be designated as node A. Opposite the node A, the stub 120A is terminated in an open circuit (O. C.). Opposite the coupling capacitor 106A, the pump feedline 108 is connected to a microwave measurement/analysis device 150. The microwave measurement/analysis device 150 is configured to measure the pump signal 130 in reflection after pump signal 130 has interacted with microwave device 100. The microwave measurement/analysis device 150 may include and/or be connected to a computer for determining the phase shift (in the frequency) in the pump signal as discussed further herein. The microwave measurement/analysis device 150 may include and/or be connected to one or more processors, memories (e.g., computer readable storage medium) display screens, input devices (e.g., mouse, keyboard, touch screen, etc.). The pump 135 and microwave measurement/analysis device 150 are operatively connected to the microwave device 100 via a circulator 180A but are not part of the microwave device 100.

In the microwave device 100, one end of the quarter wavelength signal resonator 104 is connected to a coupling capacitor 106B, and the coupling capacitor 106B connects to a signal feedline 109. The signal feedline 109 is connected to a signal port 113 and/or the signal port 113 is on the signal feedline 109. The signal feedline 109 is configured to receive a microwave quantum signal 140, i.e., microwave signal being measured/tested, from a quantum device 145. The quantum device 145 may be a qubit, a cavity coupled to a qubit, etc. The other end of the signal resonator 104 connects to the Josephson junction (JJ) 110 and connects to a half-wavelength stub at the pump frequency 120B. The connection of the pump resonator 102, Josephson junction (JJ) 110, and stub 120B may be designated as node B. Opposite the node B, the stub 120B is terminated in a short-circuit. The signal feedline 109 may be connected to the quantum device 145 and a measurement/analysis device 144 via a circulator 180B. The measurement/analysis device 144 may be utilized for further processing. In one implementation, the device 144 may represent a 50 ohm termination. The port of the circulator 180B connected to the measurement/analysis device 144 ensures that no reflected signal is transmitted back to the quantum device 145.

The pump resonator 102 has a fundamental mode, which may be referred to as the pump mode or pump resonance mode. The pump mode of the pump resonator 102 has a resonance frequency, which may be referred to as the pump resonance frequency $f_P$. The pump mode of the pump resonator 102 has a wavelength $\lambda_P$, where $\lambda_P = c'/f_P$ and c' is the speed of light in the transmission line or waveguide used in the implementation of the device 102. The pump signal 130 applied to the pump resonator 102 is a strong coherent resonant tone (i.e., its frequency matches the resonance frequency of the pump resonator 102). The pump resonator 102 is designed to have a length corresponding to $\lambda_P/4$, which is quarter the wavelength of the pump signal. The stubs 120A and 120B are each designed to have a length corresponding to $\lambda_P/2$, which is half the wavelength of the pump signal.

The signal resonator 104 has a fundamental mode, which may be referred to as the signal mode or signal resonance mode. The signal mode of the signal resonator 104 has a resonance frequency, which may be referred to as the signal resonance frequency $f_S$. The quantum microwave signal 140 input to the signal resonator is a weak resonant tone on the order of a few single photons, whose frequency $f_S$ matches the resonance frequency of the signal mode. The signal mode of the signal resonator 104 has a wavelength $\lambda_S$, where $\lambda_S = c'/f_S$ and c' is the speed of light in the transmission line or waveguide used in the implementation of the device. The signal resonator 104 is designed to have a length corresponding to $\lambda_S/4$, which is a quarter the wavelength of the quantum signal.

The microwave device 100 has a frequency condition between the (pump) resonance frequency of the pump resonator 102 and the (signal) resonance frequency of the signal resonator 104. The frequency condition is that the pump resonance frequency $f_P$ of the pump resonator 102 is equal to twice the signal resonance frequency $f_S$ of the signal resonator 104. In other words, the frequency condition is $f_P = 2 \cdot f_S$. Accordingly, the applied signal 130 has a frequency $f_P$ that is twice the frequency $f_S$ of the quantum signal 140.

The microwave device 100 is configured such that the reflected pump signal 130 (identified as, e.g., as reflected pump signal 130') carries information about the number of photons present in the input quantum signal 140, and thereby can be utilized to count the photons in the quantum signal 140. Additionally, the reflected quantum signal 140 (identified as, e.g., reflected quantum signal 140') carries information about the number of photons present in the input pump signal 130, and thereby can be utilized to count the photons in the pump signal 130. This information about the number of photons in the quantum signal 140 is encoded in the phase shift of the reflected pump signal 130' off port 108 as a result of the resonance frequency shift of the pump resonator 102 depending on the number of photons in the signal resonator 104. The phase shift in the reflected pump signal 130' is measured and analyzed by the microwave measurement/analysis device 150.

The microwave device 100 (and/or operation via pump signal 130 and quantum signal 140) is configured such that it can be described by the effective Hamiltonian (without the drives and feedlines) $H_{eff} = \hbar\tilde{\omega}_P N_P + \hbar\tilde{\omega}_S N_S + \hbar K N_P^2 + \hbar K' N_P N_S$, where $\hbar\tilde{\omega}_P N_P$ represents the pump resonance mode term (modelled as a harmonic oscillator with $\tilde{\omega}_P$ the dressed resonance frequency of the pump resonance mode), $\hbar\tilde{\omega}_S N_S$ represents the signal resonance mode term (modelled as a harmonic oscillator with $\tilde{\omega}_S$ the dressed resonance frequency of the signal resonance mode), $\hbar K N_P^2$ represents the self-Kerr nonlinearity of the device, and $\hbar K' N_P N_S$ represents the cross-Kerr nonlinearity of the device. Further, K is the self-Kerr constant (i.e., the Kerr frequency shift per photon), and K' is the cross-Kerr constant (i.e., the cross-Kerr frequency shift per photon). Additionally, $N_P$ is the photon number operator of the pump mode (whose eigenvalue is the number of photons in the pump resonance mode), where $N_P = \alpha_P^\dagger \alpha_P$, and $N_S$ is the photon number operator of the signal mode (whose eigenvalue is the number of photons in the signal resonance mode), where $$N_S = a_S^\dagger a_S, \text{ and } \hbar = \frac{h}{2\pi},$$

where h is Planck's constant. Also, $\alpha_P$ and $\alpha_S$ are quantum operators (i.e., annihilation operators associated with the pump and signal resonance modes). It is noted that sometimes in this disclosure the symbols $N_P$, $N_S$ may be utilized to represent the eigenvalues of the number operators and not the number operators themselves. It is also noted that any person who is skilled in the art can easily make this distinction from the context.

Figure 2:
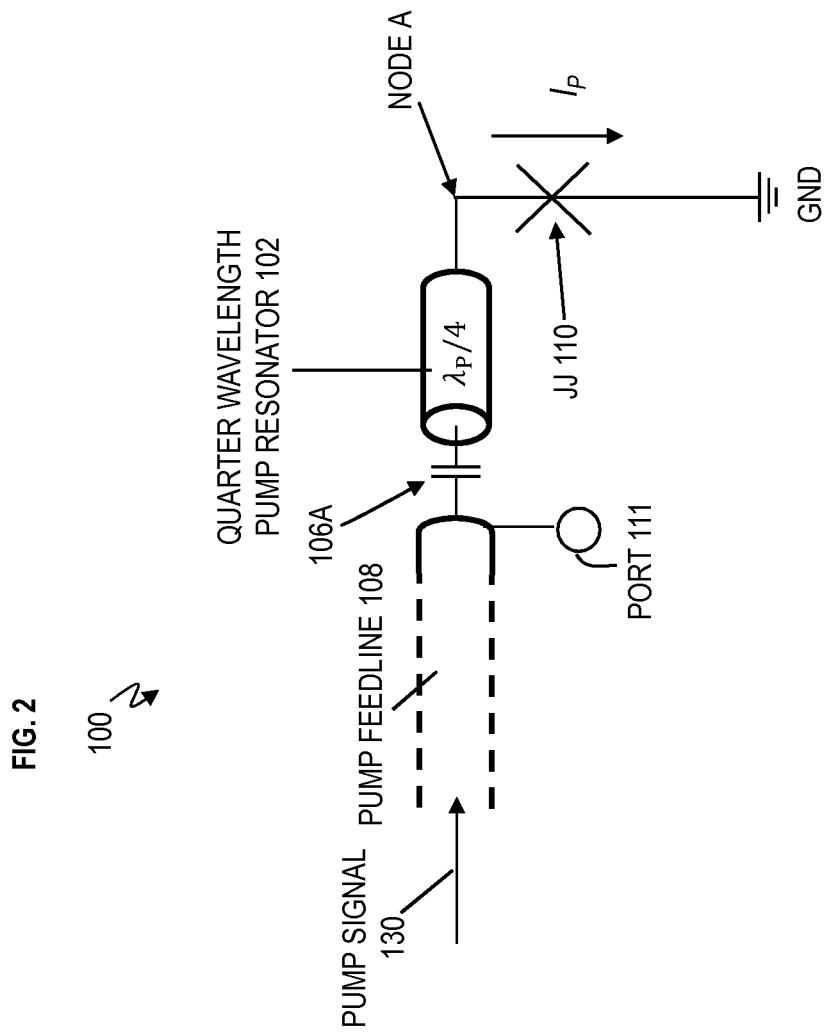
FIG. 2 is a schematic of an equivalent circuit of the microwave device as seen by the pump port according to an embodiment.

FIG. 2 is a schematic of the equivalent circuit of the microwave device 100 according to an embodiment as seen by the pump port 111. In addition to illustrating what the pump port 111 sees, FIG. 2 concurrently illustrates the circuit as seen by the incoming pump signal 130 at the pump resonance frequency $f_P$. Accordingly, discussion regarding the pump port 111 applies to the incoming pump signal 130.

In the pump equivalent circuit, FIG. 2 shows the pump feedline 108 (including pump port 111) coupled to the transmission line part of the pump resonator 102 via the coupling capacitor 106A, and the other end of the transmission line part of the pump resonator connected to ground via the Josephson junction 110. To explain this equivalent circuit, it is noted that 1) stub 120A, which serves as an impedance transformer, is terminated in an open circuit and its length corresponds to half the wavelength of the pump signal 130, thus node A sees an open circuit at the pump frequency, and 2) stub 120B, which serves as an impedance transformer, is terminated in a short circuit and its length corresponds to half the wavelength of the pump signal 130, thus node B sees a short circuit at the pump frequency.

One beneficial result of this pump equivalent circuit is that it shows that the pump resonance mode does not see the signal resonator 104. In other words, the pump resonator 102 is isolated from the signal resonator 104.

Another beneficial result is that the rf-current $I_P$ associated with the pump resonance mode has an anti-node at the location of the Josephson junction 110.

Figure 3:
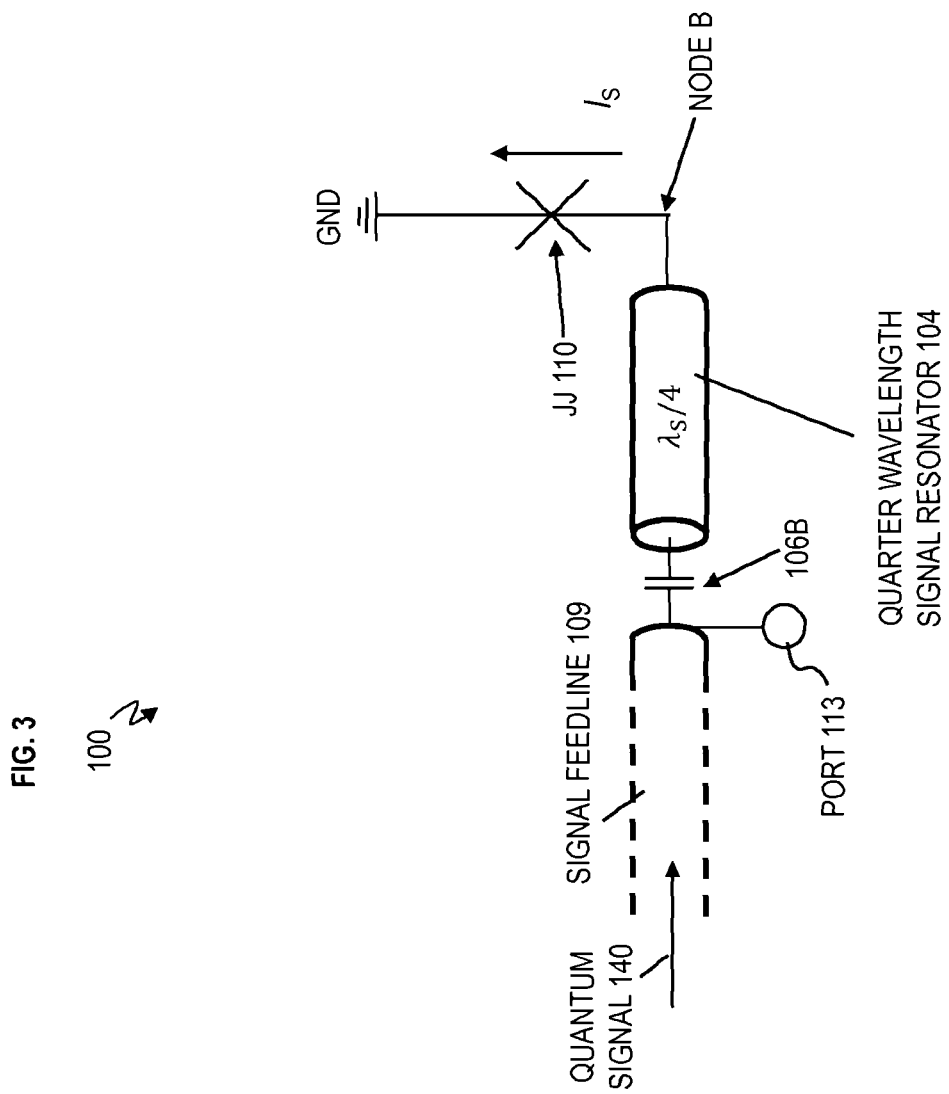
FIG. 3 is a schematic of an equivalent circuit of the microwave device as seen by the signal port according to an embodiment.

FIG. 3 is a schematic of the equivalent circuit of the microwave device 100 as seen by the quantum signal port 113 according to an embodiment. In addition to illustrating what the signal port 113 sees, FIG. 3 concurrently shows the equivalent circuit as seen by the incoming quantum signal 140 at the signal resonance frequency $f_S$. Accordingly, discussion regarding the signal port 113 applies to the incoming quantum signal 140.

In the equivalent circuit of the microwave device 100 which is seen by the signal port, FIG. 3 shows the signal feedline 109 (including signal port 113) coupled to the transmission line part of the signal resonator 104 via the coupling capacitor 106B, and the other end of the transmission line part of the signal resonator 104 connected to ground via the Josephson junction 110. Since the frequency condition for the pump frequency is $f_P = 2 \cdot f_S$ (the fundamental resonance mode of the pump resonator 102 corresponds to the pump frequency $f_P$ while the fundamental resonance mode of the signal resonator 104 corresponds to the signal frequency $f_S$), the signal port 113 (quantum signal 140 at the signal resonance frequency $f_S$) sees the opposite of the pump port 111.

In this case (i.e., the case of the signal port), stub 120B, which serves as an impedance transformer, is terminated in a short circuit and its length corresponds to quarter the wavelength of the signal, thus node B sees an open circuit at the signal frequency. Similarly, stub 120A, which serves as an impedance transformer, is terminated in an open circuit and its length corresponds to quarter the wavelength of the signal, thus node A sees a short circuit at the signal frequency.

One beneficial result of this signal equivalent circuit is that it shows that the signal resonance mode does not see the pump resonator 102. In other words, the signal resonator 104 is isolated from the pump resonator 102.

Another beneficial result is that the rf-current $I_S$ associated with the signal resonance mode has an anti-node at the location of the Josephson junction 110.

It is noteworthy to clarify here based on FIGS. 2 and 3, that 1) the pump resonator 102 (ignoring the coupling capacitor and feedline) consists of the quarter-wavelength transmission line at the pump frequency shorted to ground via the Josephson junction 110, and 2) the signal resonator 104 (ignoring the coupling capacitor and feedline) consists of the quarter-wavelength transmission line at the signal frequency shorted to ground via the Josephson junction 110.

The microwave device 100 is configured to couple two microwave resonance modes (i.e., the pump resonance mode and the signal resonance mode) to a common dispersive nonlinear element, i.e., Josephson junction 110.

The microwave device 100 is configured to use one mode, i.e., the pump mode at the pump resonance frequency $f_P$, as a photon number detector of the photons present in the second mode, i.e., the quantum signal mode at the signal resonance frequency $f_S$. In the microwave device 100, the signal resonance frequency $f_S$ of the signal mode corresponds to the microwave frequency of the microwave photons that are to be detected and/or counted.

By driving the pump mode (of the pump resonator 102) using a strong coherent microwave tone (i.e., pump signal 130) at the pump resonance frequency $f_P$, the microwave device 100 is configured to give rise to a cross-Kerr nonlinear effect in the Josephson junction 110 which leads to a nonlinear interaction between the pump and signals modes (and consequently between the pump signal 130 at the pump resonance frequency $f_P$ and the quantum signal 140 at the signal resonance frequency $f_S$).

As a result of this cross-Kerr effect, the microwave device 100 is configured such that the pump resonance frequency $f_P$ of the pump mode becomes dependent on the number of photons in the signal resonance mode at frequency $f_S$ and vice versa.

The microwave device 100 is configured such that by monitoring the phase of the reflected pump signal 130' at frequency $f_P$, the measurement/analysis device 150 can detect in a quantum nondemolition measurement the presence or absence of signal photons in the signal mode (i.e., detect the presence or absence of signal photons in the quantum signal 140 at frequency $f_S$).

The microwave device 100 is configured such that the number of photons in the signal mode is inferred/determined based on the size of the phase shift acquired by the output pump signal 130' (as measured in reflection by the measurement/analysis device 150 at the pump feedline 108). Hence, the microwave device 100 serves as a nondemolition microwave photon detector and counter. By introducing a frequency shift in the resonance frequency of the pump mode, the microwave device 100 neither absorbs nor destroys the signal photons in the quantum signal 140. Rather, the quantum signal is reflected off 104' the microwave device 100 at the signal feedline 109 after interacting with the pump signal 130 in the device 100 via the Josephson junction 110.

It is noted that in addition to the pump and signal modes which are measured in reflection and explained in detail above, the microwave device 100 has also two common resonance modes which can be measured in transmission between the pump and signal ports. However, these common resonance modes do not play a role in the signal-pump interaction described above and have frequencies that are far detuned from the pump and signal resonance modes (thus can be filtered out if necessary). For example, for a device with a pump resonance frequency around 16 GHz, and a signal resonance frequency around 8 GHz, the common modes of the device are expected to resonate at around 3 GHz, and 13 GHz.

Two beneficial advantages of the microwave device 100 which can be readily inferred from the device description are the following:

1) the strong pump drive (i.e., pump signal 130) which enables the detection of the signal photons is injected through a different port than the weak signal (e.g., quantum signal 140) being detected; and 2) the pump and signal modes are completely isolated from each other (due to the use of the stubs). They only interact through the JJ (or JJs) which connects their respective resonators. Hence, by design there should not be any direct power leakage between the pump and signal ports.

Figure 4:
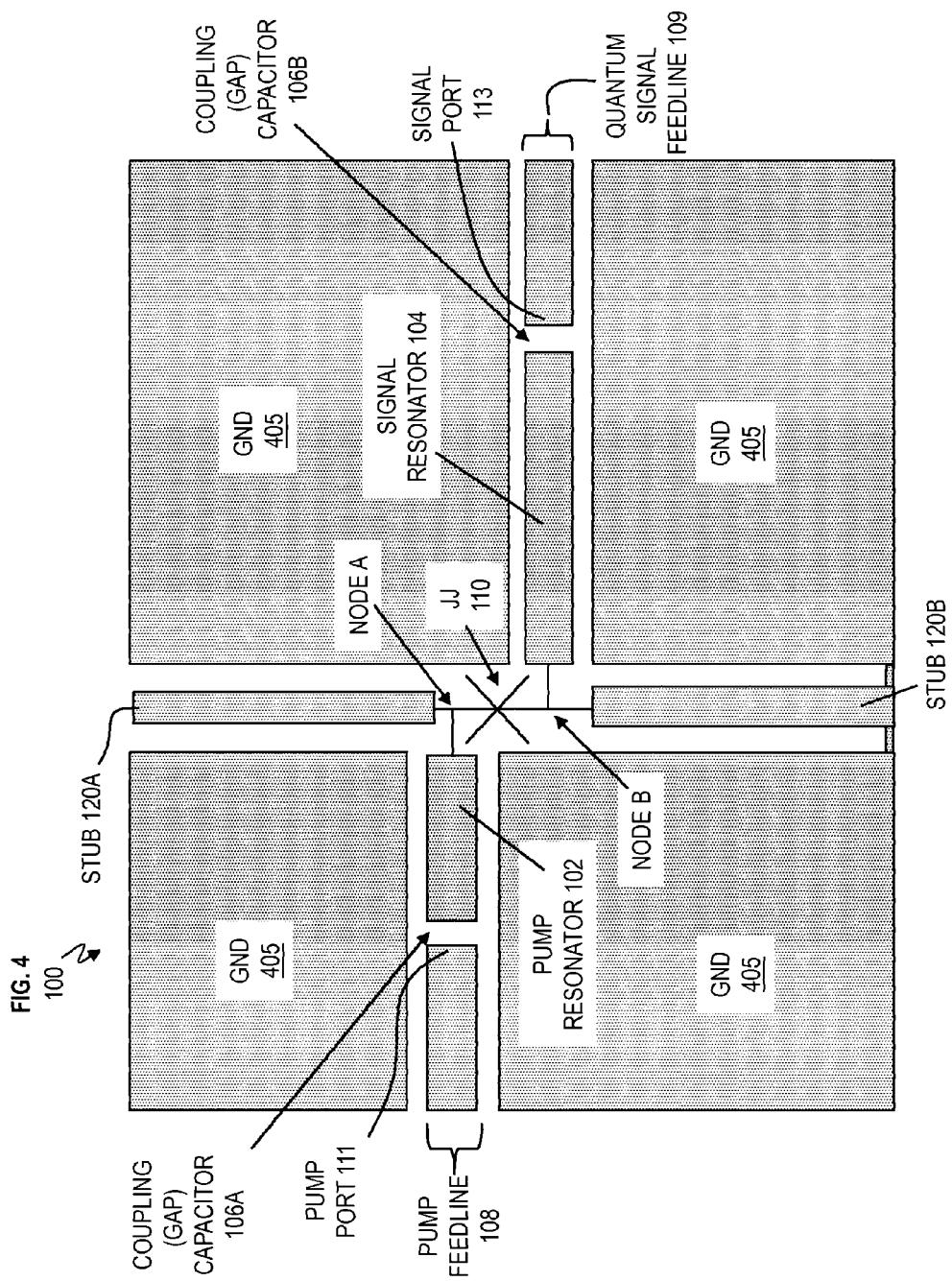
FIG. 4 is a schematic of an example implementation of the microwave device using a coplanar waveguide geometry according to an embodiment.

FIG. 4 is a schematic of the microwave device 100 implemented as a coplanar waveguide according to an embodiment. In FIG. 4, a pump feedline 108 is connected to the pump resonator 102 by the coupling capacitor 106A. The pump feedline 108 and the pump resonator 102 are made of superconductors formed on a low-loss dielectric substrate. The coupling capacitor 106A is implemented as a gap capacitor between the conductors of the pump feedline 108 and pump resonator 102. The pump resonator 102 has a length corresponding to approximately $\lambda_P/4$ (for a particular pump resonance frequency this length can vary depending on the amount of lumped inductance added by the Josephson junction 110 terminating the transmission line part of the pump resonator). A ground plane 405 is formed on both sides of the pump resonator 102 and pump feedline 108.

A quantum signal feedline 109 is connected to the signal resonator 104 by the coupling capacitor 106B. The signal feedline 109 and the signal resonator 104 are also made of superconductors formed on the low-loss dielectric substrate. Similarly, the coupling capacitor 106B is implemented as a gap capacitor between the conductors of the signal feedline 109 and signal resonator 104. The signal resonator 104 has a length corresponding to approximately $\lambda_S/4$ (for a particular signal resonance frequency this length can vary depending on the amount of lumped inductance added by the Josephson junction 110 terminating the transmission line part of the signal resonator). A ground plane 405 is formed on both sides of the signal resonator 104 and signal feedline 109.

At node A, the pump resonator 102 is connected to the Josephson junction 110 and the stub 120A. The other end of the stub 120A is left open (i.e., terminated in an open circuit).

At node B, the signal resonator 104 is connected to the Josephson junction 110 and the stub 120B. The other end of the stub 120B is connected to the ground plane 405. The stubs 120A and 120B are superconducting transmission lines implemented in this embodiment in the form of a coplanar waveguide on the low-loss dielectric substrate, and the center conductor of the stubs 120A and 120B each have a length corresponding to $\lambda_P/2$.

The Josephson junction 110 is a dispersive nonlinear inductor, which is made of two superconducting electrodes separated by a barrier (e.g., insulating tunnel barrier). For example, one superconducting electrode of the Josephson junction 110 connects to node A, while the other superconducting electrode connects to node B.

Figure 5:
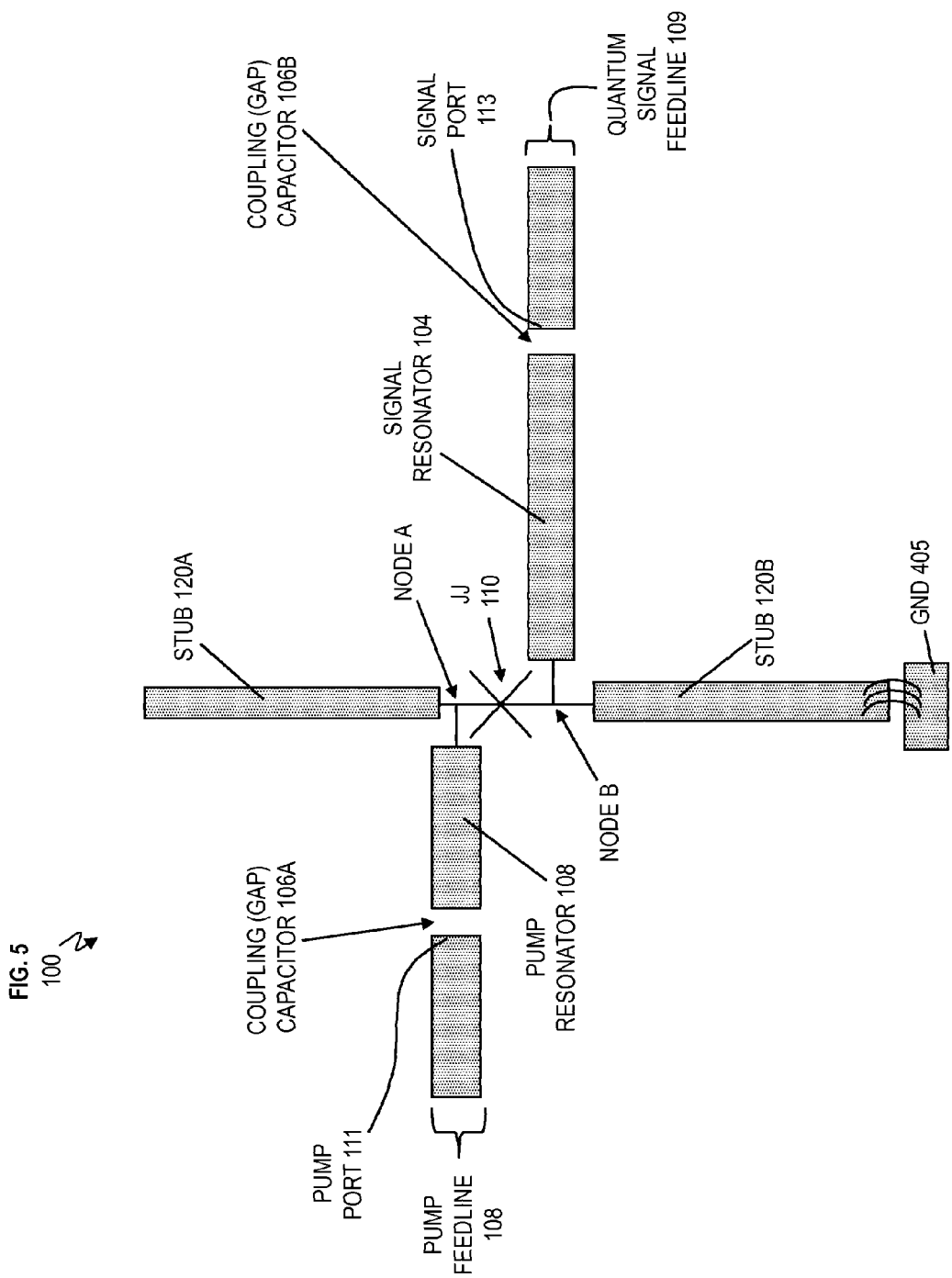
FIG. 5 is a schematic of an example implementation of the microwave device using a microstrip geometry according to an embodiment.

FIG. 5 is a schematic of the microwave device 100 implemented in the form of a microstrip geometry according to an embodiment. FIG. 5 is similar to FIG. 4 in that the microstrip implementation has superconductors formed on a low-loss dielectric substrate according to the microwave device 100. One main difference between the microstrip and the coplanar waveguide implementations relates to the location of the ground plane. In the coplanar waveguide configuration (FIG. 4) the ground plane is located on the same side of the dielectric substrate as the center conductor, whereas in the micorstrip configuration (FIG. 5) the ground plane is on the opposite side of the dielectric substrate.

In FIG. 5, a pump feedline 108 is connected to the pump resonator 102 by the coupling capacitor 106A. The pump feedline 108 and the pump resonator 102 are superconductors formed on a low-loss dielectric substrate. The coupling capacitor 106A is implemented as a gap capacitor between the conductors of the pump feedline 108 and pump resonator 102. The pump resonator 102 has a length corresponding to $\lambda_P/4$ (for a particular pump resonance frequency this length can vary depending on the amount of lumped inductance added by the Josephson junction 110 terminating the transmission line part of the pump resonator). However, unlike FIG. 4, no ground plane is formed on both sides of the pump resonator 102 and pump feedline 108, and instead the ground plane is formed on the other side of the dielectric substrate.

A quantum signal feedline 109 is connected to the signal resonator 104 by the coupling capacitor 106B. The signal feedline 109 and the signal resonator 104 are also superconductors formed on the low-loss dielectric substrate. Similarly, the coupling capacitor 106B is implemented as a gap capacitor between the conductors of the signal feedline 109 and signal resonator 104. The signal resonator 104 has a length corresponding to $\lambda_S/4$ (for a particular signal resonance frequency this length can vary depending on the amount of lumped inductance added by the Josephson junction 110 terminating the transmission line part of the signal resonator). Unlike FIG. 4, no ground plane is formed on both sides of the signal resonator 104 and signal feedline 109, and instead the ground plane is formed on the other side of the dielectric substrate.

At node A, the pump resonator 102 is connected to the Josephson junction 110 and the stub 120A. The other end of the stub 120A is left open (i.e., terminated in an open circuit).

At node B, the signal resonator 104 is connected to the Josephson junction 110 and the stub 120B. The other end of the stub 120B is connected to the ground plane 405. The stubs 120A and 120B are superconducting transmission lines implemented in this embodiment in the form of a microstrip on the low-loss dielectric substrate, and the center conductor of the stubs 120A and 120B each have a length corresponding to $\lambda_P/2$.

In accordance with the teachings presented herein, one of ordinary skill in the art recognizes other possible implementations or variations to embodiments. In one implementation, the pump and signal resonators 102 and 104 may be equivalently implemented using lumped inductors (e.g., narrow superconducting wires or array of large Josephson junctions) and lumped capacitors (e.g., planar capacitors or interdigitated capacitors). One particular condition in the various implementations is to maintain maximum RF currents of the pump and signal modes at the Josephson junction 110 location.

In another implementation, the half-wave stubs 120A and 120B of the microwave device 100 can also implemented using their equivalent lumped-element circuit in the vicinity of the pump resonance frequency.

In one implementation, the single Josephson junction 110 may be replaced by an array of large Josephson junctions.

In yet another implementation, the single Josephson junction 110 may be replaced by a direct current superconducting quantum interference device (DC-SQUID) (or array of DC-SQUIDs) which enables in-situ tuning of the linear inductance of the mixing element (i.e., the inductance of the Josephson junctions in the DC-SQUID) by varying the magnetic flux threading the DC-SQUID loop (or the loops of the array of DC-SQUIDs).

According to an implementation, the microwave device 100 can be made frequency tunable by incorporating DC-SQUIDs in the device resonators, stubs, and the nonlinear mixing element (i.e., the Josephson junction 110 or array of Josephson junctions).

More detail of the theory for the photon counting and detection in the microwave device 100 is discussed. For ease of understanding, sub-headings are provided below. It is understood that the sub-heading are for explanation purposes and not limitation.

I. The Energy of the Josephson Junction

A supercurrent flowing in a Josephson junction satisfies the current-phase relation given by $I_J=I_0 \sin \delta$, where $I_0$ is the critical current of the Josephson junction, $\delta$ is the gauge-invariant phase difference. The energy of the Josephson junction can be written as $E_J=E_J[1-\cos \delta]$, where $E_J=I_0\varphi_0$ is the Josephson energy and $\varphi_0=\hbar/2e$ is the reduced flux-quantum (e is the electron charge). By using the trigonometric identity $\cos x = \sqrt{1-x^2}$ we can rewrite the energy of the Josephson junction as $$E_J = E_J\left[1 - \sqrt{1-\left(\frac{I_J}{I_0}\right)^2}\right].$$

Expanding the expression for the energy of the Josephson junction up to fourth order in current we get $$E_J \simeq \frac{E_J}{2}\left(\frac{I_J}{I_0}\right)^2 - \frac{E_J}{24}\left(\frac{I_J}{I_0}\right)^4.$$

By substituting the junction inductance $$L_J = \frac{E_J}{I_0^2}$$

we obtain $$E_J \simeq \frac{L_J}{2}I_J^2 - \frac{L_J}{24}\frac{I_J^4}{I_0^2}, \qquad \text{(Eq. 1)}$$

where the first term ($\propto I_J^2$) modifies the bare resonance frequencies of the pump and signal resonators while the second term ($\propto I_J^4$) represents the nonlinear mixing term.

II. Quantization

Based on the equivalent circuits of the microwave device as seen by the pump and signal ports shown in FIGS. 2, 3, the Radio frequency (RF) current flowing in the Josephson junction is $I_J=I_P-I_S$, where $I_P$ and $I_S$ are the rf-currents of the pump and signal microwave resonance modes flowing in the Josephson junction.

Expressing the currents $I_P$, $I_S$ in terms of the quantum operators $\alpha_P$, $\alpha_S$ which represent the annihilation operators associated with the pump and signal resonance modes gives $$I_P = i\hat{I}_P(\alpha_P^\dagger - \alpha_P) \qquad \text{(Eq. 2)}$$

$$I_S = i\hat{I}_S(\alpha_S^\dagger - \alpha_S) \qquad \text{(Eq. 3)}$$

where $\hat{I}_P$, $\hat{I}_S$ are the zero-point fluctuations (ZPF) current amplitudes given by $$\hat{I}_P = \omega_P\sqrt{\frac{\hbar}{2Z_P}} \text{ and } \hat{I}_S = \omega_S\sqrt{\frac{\hbar}{2Z_S}},$$

where $\omega_P$ and $\omega_S$ are the angular resonance frequencies of the pump and signal resonators, and $Z_P$ and $Z_S$ are the characteristic impedances of the corresponding resonators.

Using the following expressions for the angular resonance frequencies $$\omega_P^2 = \frac{1}{L_P C_P}, \omega_S^2 = \frac{1}{L_S C_S}$$

and resonator impedances $$Z_P^2 = \frac{L_P}{C_P}, Z_S^2 = \frac{L_S}{C_S}$$

the ZPF current amplitudes can be rewritten as $$\hat{i}_P^2 = \frac{\hbar}{2}\frac{\omega_P}{L_P}, \text{ and} \quad \text{(Eq. 4)}$$

$$\hat{i}_S^2 = \frac{\hbar}{2}\frac{\omega_S}{L_S}, \quad \text{(Eq. 5)}$$

where $L_P$, $L_S$ and $C_P$, $C_S$ represent the inductances and capacitances of the equivalent LC circuit of the pump and signal resonators at resonance.

III. Effective Hamiltonian of the System

Without taking into account the feedlines, drives, and loss to the environment the effective Hamiltonian of the system is given by the sum $$H_{eff} = H_{res} + E_J, \quad \text{(Eq. 6)}$$

where $H_{res} = \hbar\omega_P N_P + \hbar\omega_S N_S$, and $N_P = \alpha_P^\dagger \alpha_P$, $N_S = \alpha_S^\dagger \alpha_S$ are the photon number operators for the pump and signal modes.

Substituting Eqs. 2 and 3 into the expression for $E_J$ (i.e., Eq. 1) while using Eqs. 4 and 5, the photon number operators $N_P$, $N_S$, the imposed frequency condition $\omega_P = 2\omega_S$, and the rotating wave approximation, we can write the effective Hamiltonian of the system (Eq. 6) in the form $$H_{eff} = \hbar\tilde{\omega}_P N_P + \hbar\tilde{\omega}_S N_S + \hbar K N_P^2 + \hbar K' N_P N_S \quad \text{(Eq. 7)}$$

where $\tilde{\omega}_P$, $\tilde{\omega}_S$ in the first and second term are the dressed angular resonance frequencies of the pump and signal modes which include the inductive loading of the resonators due to the Josephson junction (represented by the first term in Eq. 1), and K, K' in the third and fourth term which represent the self-Kerr and cross-Kerr nonlinearity correspond to the self-Kerr and cross-Kerr constants respectively.

In the derivation of Eq. 7, we have also used the fact the pump mode is driven strongly compared to the signal mode, and that the bosonic operators of the two modes $\alpha_P$, $\alpha_S$ commute with each other and those of the same mode satisfy the usual commutation relations of the form $[\alpha_P, \alpha_P^\dagger]=1$, $[\alpha_S, \alpha_S^\dagger]=1$.

The self-Kerr constant in Eq. 7 is given by $$K = -\frac{L_J}{4 I_0^2}\frac{\hat{i}_P^4}{\hbar},$$

which we can rewrite in terms of the participation ratio $$p_P = \frac{L_J}{L_P}$$

of the linear inductance of the JJ to the total inductance of the pump resonator and the plasma frequency of the JJ $$\omega_J = \frac{I_0}{2e}$$

$$K = -\frac{p_P^2 \omega_P^2}{16\omega_J}. \quad \text{(Eq. 8)}$$

Similarly, the cross-Kerr constant in Eq. 7 is given by $$K' = -\frac{L_J}{I_0^2}\frac{\hat{i}_P^2 \hat{i}_S^2}{\hbar},$$

which we can rewrite in terms of $p_P$, $\omega_J$, and the participation ratio $$p_S = \frac{L_J}{L_S}$$

of the linear inductance of the JJ to the total inductance of the signal resonator $$K' = -\frac{p_P p_S \omega_P \omega_S}{4\omega_J}. \quad \text{(Eq. 9)}$$

IV. Resonance Frequency Shift Per Photon

To better understand the basic idea of the device, we rearrange the terms in Eq. 7 such that the effective Hamiltonian of the system reads $$H_{eff} = \hbar(\tilde{\omega}_P + K N_P + K' N_S)N_P + \hbar\tilde{\omega}_S N_S. \quad \text{(Eq. 10)}$$

This form shows that by operating the device in the nonlinear regime where the Kerr effect is appreciable, the self-Kerr and cross-Kerr nonlinearity cause the dressed angular resonance frequency of the pump mode to shift depending on the number of photons present in the pump and signal resonance modes. Furthermore, since the pump mode is externally driven at a certain working point, signal photons that enter the signal resonator would shift the pump resonance frequency by $K'N_S$, which is proportional to their number, thus the cross-Kerr constant K' corresponds to frequency shift per photon.

It is noted that in order to detect (i.e., resolve the presence of) a single microwave photon using this device the frequency shift per photon due to the cross-Kerr nonlinearity (i.e., K') should be equal or larger than the linewidth (i.e., bandwidth) of the pump resonance mode at the working point.

V. Design Example Using Typical Numerical Values

In a design example of the proposed microwave device 100, feasible numerical values of the various parameters are utilized. The dressed resonance frequency for the pump mode is $$\frac{\tilde{\omega}_P}{2\pi} = 16 \text{ GHz}.$$

The dressed resonance frequency for the signal mode is $$\frac{\tilde{\omega}_S}{2\pi} = 8 \text{ GHz}.$$

The impedance of the resonators $Z_P = Z_S = 50\Omega$ (please note that lower characteristic impedances are also feasible and are expected to be more favorable with respect to the device performance). Using the relation $$L_{P,S} = \frac{Z_{P,S}}{\omega_{P,S}},$$

we get an estimate for $L_P = 0.5$ nanoHenry (nH), $L_S = 1$ nH. Assuming $I_0 = 1$ microampere (µA), then $$L_J = 0.3 \text{ nH and } \frac{\omega_J}{2\pi} = 497 \text{ GHz}.$$

Using the values for $L_{P,S}$ and $L_J$ we get an estimate for the participation ratios for the pump and signal resonators $p_P \approx 0.38$ and $p_S \approx 0.23$. Substituting these values in Eqs. 8 and 9 yields $$\frac{K}{2\pi} \simeq -4.6 \text{ MHz and } \frac{K'}{2\pi} \simeq -5.6 \text{ MHz}.$$

By designing the pump resonance mode to have a linewidth smaller than these frequency shifts per photon (which is completely achievable with state-of-the-art superconducting microwave circuits), the microwave device 100 is configured to detect single quantum signal photons as measured by the measurement/analysis device 150.

In order for the device to work properly in one implementation, it needs to satisfy two additional requirements. For the first requirement, the internal quality factor of both resonators should be as high as possible at the single photon level $>10^5$ and at least 2 orders of magnitude larger than the external quality factor of the resonators set by the coupling capacitors between the resonators and the feedlines and their characteristic impedances. This requirement is so that the signal photons being detected and the pump photons detecting them do not get lost to internal loss mechanisms in the resonators at a higher rate than the rate at which they enter and leave both resonators. One obvious consequence of this requirement is that the total quality factor of both resonators is mainly set by the external quality factor.

For the second requirement, the bandwidth of the pump resonator at the bias point should be equal or larger than the bandwidth of the signal resonator. In other words, the response time of the pump resonator should be equal or shorter than the response time of the signal resonator. This requirement is in order to allow a sufficient time for the pump photons to detect the signal photons before they leave the device through the signal feedline. It is noted that both requirements are achieved in superconducting microwave circuits discussed herein.

In one implementation, a technique to (experimentally) calibrate the value of the cross-Kerr constant K' for a certain pump drive is by varying the input power of a coherent tone applied at the signal frequency to the signal resonator while measuring—for each input power—the complex reflection parameter of the pump resonator as a function of frequency using a very weak probe (less than one photon on average) superimposed on the pump drive. By extracting the slope of the measured pump resonance frequency versus signal power and using beforehand knowledge of the signal resonance frequency and the signal resonator bandwidth, one can calculate the constant K'.

In one implementation, a technique to (experimentally) detect single signal photons using this device is by monitoring the phase of the reflected pump drive applied at the pump resonance frequency with no input signal (i.e., $N_S = 0$). When signal photons on the order of 1-3 photons enter the signal resonator and interact with the pump mode through the JJ (i.e., the nonlinear dispersive element) the resonance frequency of the pump mode shifts downwards by a multiple number of $K'/2\pi$ that is proportional to the number of signal photons in the signal resonator. As a consequence of this resonance frequency shift of the pump mode, the phase of the reflected pump drive is correspondingly shifted as well. By measuring this phase shift one can infer the number of signal photons (on the order of 1-3) that entered the device.

In order to count in real-time a larger number of incoming signal photons, e.g., between 3 to 10, using the device, one may employ a more elaborate measurement technique. For example, continuous monitoring may be performed of the reflected phase of multiple relatively weak tones (in order not to alter the device operation) applied to the pump resonator at frequencies that are located $$\frac{K'}{2\pi}, \frac{2K'}{2\pi}, \dots \frac{N_S K'}{2\pi}$$

below the pump resonance frequency with no input signal (i.e., $N_S = 0$). According to this method, if a phase shift is detected in the reflected weak tone that is applied at frequency $$\frac{N_S K'}{2\pi}$$

below the pump resonance frequency with no input signal (i.e., $N_S = 0$), this indicates with high probability that the incoming signal contained $N_S$ photons.

Measuring a larger number of microwave photons beyond a few photons might not be as useful for certain quantum applications, and thus the device may not be tuned accordingly. It is also noted that the effective Hamiltonian of the system was specifically derived in the limit of very weak signal compared to the pump drive. Thus, by further increasing the strength of the signal beyond a few photons, other unwanted nonlinear terms which were neglected in the derivation of the Hamiltonian (Eq. 10) are expected to come into play. The exact number of input signal photons which the device can detect or count without a significant degradation of performance can of course vary from one device to another and from one implementation to another depending on several design parameters, such as the critical current of JJ or JJs, the participation ratios, the bandwidths of the resonators, the characteristic impedances of the resonators, and the particular implementation of the resonators.

Now turning to FIG. 6, a flow chart of a method 600 is provided for nondemolition counting and/or detection of microwave photons using the microwave device 100 according to an embodiment.

At block 605, the microwave device 100 is configured to couple a pump resonance mode (fundamental resonance mode) of the pump resonator 102 and a signal resonance mode (e.g., fundamental resonance mode) of the quantum signal resonator 104 to a dispersive nonlinear element (e.g., Josephson junction 110), responsive to the pump signal 130 at a pump resonance frequency $f_P$ and the quantum signal 140 at a signal resonance frequency $f_S$. The pump resonance mode of the pump resonator 102 has the pump resonance frequency $f_P$ and the signal resonance mode of the quantum signal resonator has the signal resonance frequency.

At block 610, the microwave device 100 is configured to create a nonlinear interaction\mixing (i.e., via the Josephson junction 110) between the pump signal 130 and the quantum signal 140, by strongly driving the pump resonance mode (i.e., pump mode) with the coherent pump signal 130 at the pump resonance frequency $f_P$.

At block 615, the microwave device 100 is configured to enable detection of the presence or absence of photons in the quantum signal 140 according to the resonance frequency of the pump mode which affects the phase of the output pump signal 130' (i.e., reflected from the microwave device 100).

The microwave device 100 is configured to excite a cross-Kerr nonlinear effect in the dispersive nonlinear element, thereby causing the nonlinear interaction between the pump signal 130 and the quantum signal 140. The microwave device 100 is configured such that the pump resonance frequency of the pump mode is dependent on the number of photons in the quantum signal 140 as a result of the cross-Kerr nonlinear effect taking place in the device (this can be shown by taking into account the input-output relations of the device).

The number of photons in the quantum signal 140 is determined by a size of a frequency shift in the pump resonance frequency. The frequency shift is a multiple of a cross-Kerr coefficient. A baseline frequency shift is established, such that the frequency shift is denoted as being greater than the baseline frequency shift previously established. The frequency shift denotes the number of the photons in the quantum signal while the baseline frequency shift is established prior to receiving the quantum signal. Each multiple of the baseline frequency shift in the pump signal denotes a single photon count of the quantum signal, such that 0-N photons corresponds to 0-M multiples of the baseline frequency shift, where N is a last number of the photons and M is a last multiple of the baseline frequency shift.

FIG. 7 is a flow chart of a method 700 for the microwave device 100 according to an embodiment. Reference can be made to FIGS. 1-5.

At block 705, the microwave device 100 is configured to receive a strong coherent pump signal 130 at the pump resonance frequency $f_P$, where the pump resonance frequency corresponds to a pump resonance (fundamental) mode of a pump resonator 102.

At block 710, the microwave device 100 is configured to receive a quantum signal 140 at the signal resonance frequency $f_S$, where the signal resonance frequency corresponds to a signal resonance (fundamental) mode of a signal resonator 104.

At block 715, the microwave device 100 is configured to output the pump signal 130' with a phase shift, in response to pump resonance frequency shift of the pump mode which depends on a number of photons in the quantum signal 140.

It will be noted that various microelectronic device fabrication methods may be utilized to fabricate the components/elements discussed herein as understood by one skilled in the art. In superconducting and semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for nondemolition counting of photons, the method comprising:
   coupling a pump resonance mode of a pump resonator and a signal resonance mode of a quantum signal resonator to a dispersive nonlinear element, responsive to a pump signal at a pump resonance frequency and a quantum signal at a signal resonance frequency, wherein the pump resonance mode of the pump resonator has the pump resonance frequency, wherein the signal resonance mode of the quantum signal resonator has the signal resonance frequency;

creating a nonlinear interaction between the pump signal and the quantum signal, by driving the pump resonance mode with the pump signal at the pump resonance frequency, wherein the pump resonator and the quantum signal resonator are different resonators; and detecting a presence or absence of photons in the quantum signal according to the pump resonance frequency which affects an output pump signal being measured.

2. The method of claim 1, further comprising exciting a cross-Kerr nonlinear effect in the dispersive nonlinear element, thereby causing the nonlinear interaction between the pump signal and the quantum signal.

3. The method of claim 1, wherein the pump resonance frequency of the output pump signal is dependent on a number of the photons in the quantum signal as a result of the cross-Kerr nonlinear effect.

4. The method of claim 3, wherein the number of photons in the quantum signal is determined by a size of a phase shift in the output pump signal.

5. A method for nondemolition counting of photons, the method comprising:

coupling a pump resonance mode of a pump resonator and a signal resonance mode of a quantum signal resonator to a dispersive nonlinear element, responsive to a pump signal at a pump resonance frequency and a quantum signal at a signal resonance frequency, wherein the pump resonance mode of the pump resonator has the pump resonance frequency, wherein the signal resonance mode of the quantum signal resonator has the signal resonance frequency;

creating a nonlinear interaction between the pump signal and the quantum signal, by driving the pump resonance mode with the pump signal at the pump resonance frequency; and detecting a presence or absence of photons in the quantum signal according, to the pump resonance frequency which affects an output pump signal being measured;

wherein a frequency shift is a multiple of a cross-Kerr coefficient, such that the multiple of the cross-Kerr coefficient is an integer multiplied by the cross-Kerr coefficient.

6. The method of claim 5, wherein a baseline frequency shift is established, such that the frequency shift is denoted as being greater than the baseline frequency shift previously established.

7. The method of claim 6, wherein the frequency shift denotes the number of the photons in the quantum signal while the baseline frequency shift is established prior to receiving the quantum signal.

8. The method of claim 7, wherein each multiple of the baseline frequency shift in the pump resonance frequency denotes a single photon count of the quantum signal, such that 0-N photons corresponds to 0-M multiples of the baseline frequency shift, where N is a last number of the photons and M is a last multiple of the baseline frequency shift.

9. A method of a microwave device, the method comprising:

receiving, by the microwave device, a pump signal at a pump resonance frequency, the pump resonance frequency corresponding to a pump resonance mode of a pump resonator;

receiving, by the microwave device, a quantum signal at a signal resonance frequency, the signal resonance frequency corresponding to a signal resonance mode of a signal resonator, wherein the pump resonator and the quantum signal resonator are different resonators; and outputting, by the microwave device, the pump signal with a phase shift, in response to a number of photons in the quantum signal.

\* \* \* \* \*